United States Patent [19]
Christopher et al.

[11] Patent Number: 5,220,211
[45] Date of Patent: Jun. 15, 1993

[54] HIGH SPEED BUS TRANSCEIVER WITH FAULT TOLERANT DESIGN FOR HOT PLUGGABLE APPLICATIONS

[75] Inventors: Robert J. Christopher, Chapel Hill; Donald J. DaCosta, Raleigh; Joseph C. Diepenbrock, Raleigh; Phillip R. Epley, Raleigh, all of N.C.

[73] Assignee: International Business Machines Corporation, Armonk, N.Y.

[21] Appl. No.: 783,801

[22] Filed: Oct. 28, 1991

[51] Int. Cl.[5] .......................................... H03K 19/003
[52] U.S. Cl. .................................. 307/443; 307/475; 370/85.1
[58] Field of Search ............... 307/443, 475, 494–495; 370/85.1; 375/7, 36, 60; 395/200, 325

[56] References Cited
U.S. PATENT DOCUMENTS

| | | |
|---|---|---|
| 4,481,625 | 11/1984 | Roberts et al. ..................... 370/85.1 |
| 4,595,923 | 6/1986 | McFarland, Jr. ............... 370/85.1 X |
| 4,736,124 | 4/1988 | McFarland, Jr. ................. 307/494 X |
| 4,825,402 | 4/1989 | Jalali ..................... 375/36 X |
| 4,885,484 | 12/1989 | Gray .................................. 307/495 |
| 4,890,010 | 12/1989 | Neudeck et al. ................ 307/475 X |
| 5,043,938 | 8/1991 | Ebersole ............................ 395/200 |

Primary Examiner—David R. Hudspeth
Attorney, Agent, or Firm—Joscelyn G. Cockburn

[57] ABSTRACT

A high-speed data transport system for use in computers, switches, microprocessors or the like includes a low impedance differential bus and a plurality of transceivers connected to the bus. Each of the transceivers is provided with a driver circuit which places data onto the bus and a receiver for accepting data from the bus. The driver includes a pseudo-differential current driving circuit arrangement which sinks current from only one side of the bus while the other side of the differential bus is undisturbed. The receiver includes a differential comparator biased to a preferred output voltage level.

25 Claims, 7 Drawing Sheets

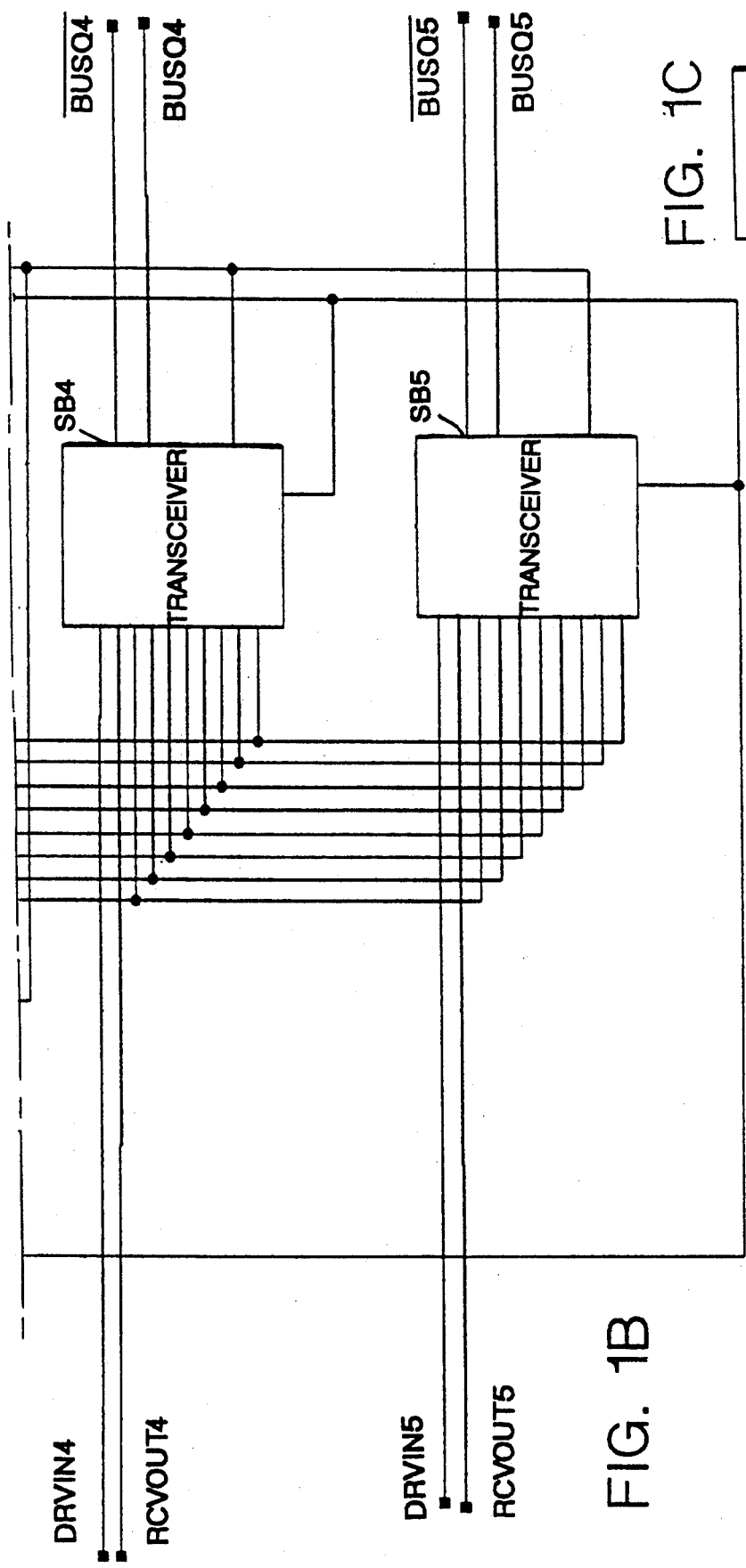
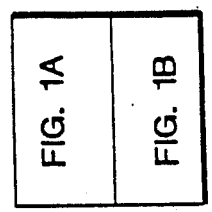
FIG. 1B
FIG. 1C

HIGH SPEED BUS TRANSCEIVER WITH FAULT TOLERANT DESIGN FOR HOT PLUGGABLE APPLICATIONS

1. FIELD OF THE INVENTION

The present invention relates to data transmission channels in general and in particular to high speed multi-dropped bus systems.

2. PRIOR ART

The use of multi-drop bus systems for transmitting data is well known in the prior art. A conventional multi-drop bus system consists of a bus structure to which a plurality of drivers and receivers are connected. An example of a prior art bus system is set forth in U.S. Pat. No. 4,596,940. According to the patent, the system consists of a differential bus with sides labelled 20 and 21 terminating, at both ends, in a resistance which is equivalent to the characteristic impedance of the differential bus. Neither side of the differential bus is coupled directly to either Vcc or Vee of the active supply voltage by passive components. Instead, each side of the bus is actively driven by one of a plurality of drivers so that as current is sinked from one side of the bus current is sourced into the other side.

One of the problems which plagues the above-referenced U.S. patent is typical of the problems experienced in other prior art bus systems. The prior art bus structure, including the bus structure in U.S. Pat. No. 4,596,940 is vulnerable to common mode and switching noises and as such cannot be used in high speed systems where noise limits overall system performance. The problem stems from the fact that a truly differential current sink driver drives both sides of the bus of U.S. Pat. No. 4,596,940 and like prior art. With this type of driver, current is simultaneously sinked and sourced from opposite sides of the bus. The simultaneously sinking and sourcing of current requires simultaneous switching of both sides of the bus which can introduce noise into the system. Similar problems are encountered in single-ended prior art bus designs, including the proposed Future Bus concept, due to large simultaneous switching currents.

Poorly or inadequately terminated buses is another source of noise in prior art multi-drop bus systems. In particular, the prior art buses are terminated at both ends with resistors whose value equals the characteristic impedance of the bus. This type of termination is referred to as "odd-mode" termination. This type of termination leads to a situation where "common-mode" signals induced in the bus "ring" for excessive periods of time, causing problems with signal integrity, EMI and common-mode range.

Viewed from current perspective, the prior art bus systems are designed for relatively low to moderate speed applications. As new digital systems are developed, they are expected to achieve superior performance to existing (i.e., prior art) systems at the lowest possible cost. The term "performance" embraces characteristics such as speed, function and reliability. There is a growing demand for digital systems that exhibit high availability and high reliability. This creates a need for buses that are fault-tolerant and hot-pluggable (i.e., buses that support the live insertion of adapter cards).

There is a well-known trend in digital systems toward ever-faster data rates. Increased data rates require higher clock rates and faster signal transitions; factors that necessitate examination of the transmission-line nature of buses. One method to keep clock rates as low as possible while still improving effective throughput of a digital system is to make buses wide, i.e., buses comprised of many bits in parallel. Bus widths in excess of 100 bits are not uncommon. Even as buses grow wider, clock rates are still increasing.

Bus systems (i.e., buses and their associated drivers and receivers) must be carefully designed to meet the complete set of requirements that result from improved performance, function and cost. This set of requirements poses a set of problems that must be solved simultaneously and optimally by the bus system. Specifically, the following problems must be solved simultaneously and optimally:

1. Speed

An entire bit transfer must occur within the time of a single clock cycle. In other words, a data bit must propagate from the input of the transmitting driver across the bus to the output of the intended receiver within a clock period. Thus, there is a "time budget" that must be met that includes:

driver circuit propagation delays, signal propagation delay through connectors and across the bus, settling time for reflections, receiver circuit propagation delays.

The clock period to which this invention is designed is 25 ns. It should be noted that this is an aggressive target for a large physical bus length and the number of card slots.

2. Noise

In addition to the noise problem alluded to above, excessive noise or inadequate noise margin can lead to performance problems through data integrity problems or through a need to reduce the clock rate to avoid data integrity problems. There are potentially several types of noise in a bus system:

Coupled noise occur when a signal on a conductor in the bus induces an undesired signal on a neighboring conductor on the bus.

Switching noise occurs when current pulses resulting from multiple bits changing states simultaneously can induce undesired signals on power and/or ground which can, in turn, induce erroneous data signals on driver or receiver outputs.

EMI/EMC noise occurs when the bus system either radiates unacceptably in certain frequency bands or is unacceptably sensitive to ambient electromagnetic radiation.

Reflection noise occurs when reflections arising from impedance mismatches on the bus distort the data signals at the inputs to the receivers. Impedance mismatches can occur at card slots, as well as at the ends of the bus due to improper termination.

3. Power Consumption

Power dissipated in the drivers must be kept to a minimum for several reasons:

to maximize the achievable packaging density, to minimize the cost of power that must be supplied to the bus system, to maximize reliability, to allow for cooling the components to a reasonable operating temperature.

At the same time, the drivers must be capable of driving the bus impedance, which can be as low as 15-20 ohms. This drive capacity is necessary because often the time budget does not allow for relying on reflections from the bus termination to create adequate signal at the receiver inputs. This type of requirement is called "incident switching."

4. Packaging Density

Drivers and receivers must be packageable at some optimum density. Too dense, and problems with coupled noise (due to long signal line lengths), switching noise, and power dissipation will be exacerbated. Not dense enough, and costs (both parts and manufacturing) are driven up while system reliability is degraded.

5. Fault-Tolerance and Hot-Pluggability

The driver and receiver circuits must be designed so that they can be inserted into a live bus without disrupting data transfers that may be in progress. Furthermore, should power fail on a particular adapter card, the drivers and receivers on that card must not load the bus so that it can no longer function.

6. Self-Diagnostic Capability

The transceiver must support operation in "wrap" mode for diagnostic purposes. In wrap mode, drivers and receivers are simultaneously active and enabled. Thus, the card can drive data onto the bus while simultaneously reading data from the bus. In this way, the functionality of the transceiver may be ascertained.

None of the prior art bus systems simultaneously and optimally solves the problems stated above.

In addition, the prior art circuit type or components used in bus design were not acceptable. Several types of prior art components were considered, but were eliminated as the difficulty in satisfying the system requirements became clear. The available circuit types fell into three general categories: Open Collector, including TTL and Future Bus; Push-Pull, and Emitter Follower ECL. In general, the available parts were eliminated due to:

1. inability to drive the current necessary to incidentally switch the bus (especially ECL, which requires an output voltage swing of about 800 mV, yet drivers are typically limited to 25 mA, less than the 53 mA required),
2. lack of the desired logical function (specifically the separate TTL inputs and outputs and separate drive and receive clocks) without using multiple packages and the resulting excessive stub capacitance,
3. high output pin capacitance and resulting large backplane impedance variation,
4. inadequate delay performance (including FutureBus)
5. simultaneous switching noise (especially FutureBus, with its 100 mA drivers),
6. coupled noise concerns with large signal swings and uncontrolled, unspecified edge rates (especially TTL)
7. high component cost, in particular, the FutureBus parts considered cost as much as $0.60 per bit, for a total bus driver cost of $67 per card (versus a $50 cost objective),
8. low output impedance, resulting in signal reflections off the active driver. This is true of all circuit types except the current source/sink disclosed hereinafter.

Other subtle concerns were raised during the initial investigation of the various circuit types, including:

Standard ECL gates do not fully cut off, even when disabled. This is to improve switching speed, but also limits the ability to "dot" outputs together due to the finite quiescent current. Unexpected effects can result due to current sharing between circuits that can drastically affect delay performance.

FutureBus requires a high current voltage regulator for the 2 volt termination supply that can handle the large, fast transient current variations (zero to temperatures in 5 nsec for 100 bits) when the drivers switch. There is no evidence that such a circuit exists.

SUMMARY OF THE INVENTION

It is therefore a general object of the present invention to provide a more efficient high performance bus system than was heretofore possible.

This and other desirable objectives are contained in the present invention in which the bus system includes a relatively low impedance multidrop transmission medium (bus) and a plurality of hybrid transceivers connected thereto.

In particular, the low impedance bus includes a plurality of conductors terminated at each end by resistors whose values are selected to terminate both the odd (differential) and even (common) mode signals on the bus.

The hybrid transceiver includes a driver and a receiver. The receiver is a differential comparator receiver biased to a known output voltage level. The biasing causes the receiver output to assume a preferred state in the absence of an input signal.

Likewise, the driver includes a pseudo-differential current sink comprised of a current-steering current sink which sinks a predetermined amount of current from one side or the other of the differential bus. When current is sinked from one side of the bus, the other side is turned off. A double latch mechanism pipelines data into the driver and out of the receiver.

Two non-overlapping clock signals insure proper staging of the data into the driver and out of the receiver but may be tied in the active state to allow data to pass through the latch circuits. Separate "enable" signals control the driver and the receiver. Wrap mode, wherein the output of a driver is fed into its receiver, is achieved by simultaneously activating the enable signals.

The foregoing features and advantages of the invention will be more fully described in the accompanying drawings.

BRIEF DESCRIPTION OF THE DRAWINGS

FIGS. 1A, 1B and 1C show a block diagram of the hybrid transceiver according to the teachings of the present invention.

DETAILED DESCRIPTION OF THE PREFERRED EMBODIMENT

Figure 1:
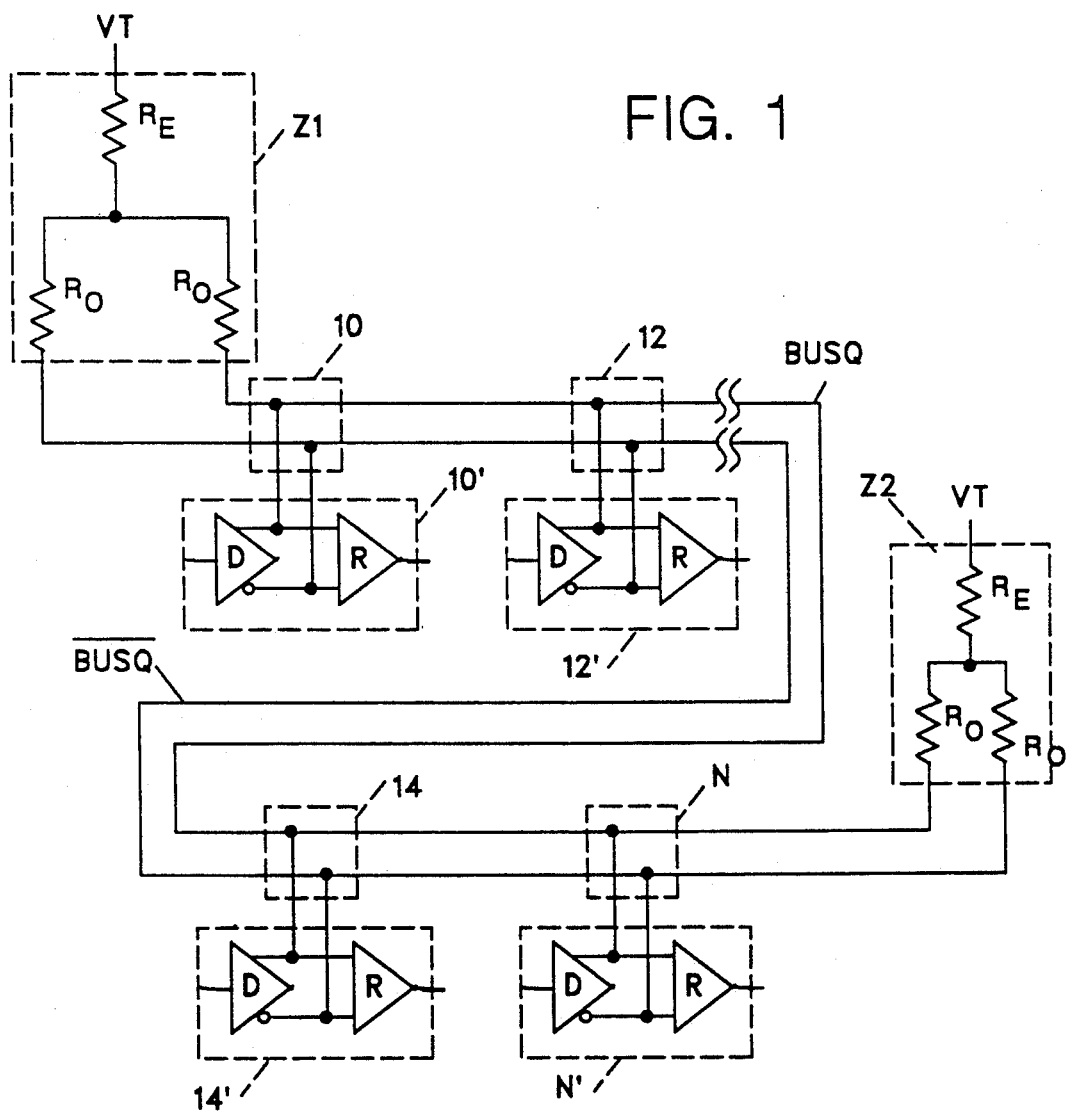
FIG. 1 represents a schematic of the low impedance multi-drop bus system according to the teachings of the present invention.

FIG. 1 is a schematic representation of the bus system according to the teachings of the present invention. The bus system includes a wide (one-hundred bits) differential bus represented by communication wires $\overline{BUSQ}$ and BUSQ. The bus is terminated by impedances Z1 and Z2 to selected terminal voltage levels ($V_T$). The impedance Z1 and Z2 are selected such that both the odd and even propagation signal modes are terminated. In particular, the value of resistors RO is set to a value of one-half the odd-mode impedance of the bus. The series combination of resistor $R_E$ with the parallel combination of two resistors R0 is chosen to equal the even mode impedance of the bus. Thus, odd mode and even mode signals propagating in the bus system are adequately terminated without signal reflection on the bus system.

A plurality of connectors 10, 12, ... N are connected at selected points along the length of the bus. The connectors form multi-drop points to which a plurality of transceivers (details to be given hereinafter) 10′, 12′, 14′ ... N′ are connected. Several known types of off-the-shelf connectors can be used to attach the transceivers. Because these connectors are well known, component details will not be given here. Suffice it to say that a connector such as Dupont Metral or AMP HDI would be suitable.

Still referring to FIG. 1, each of the transceivers is provided with a driver circuit arrangement (D) which accepts a signal on its input terminal and places it on the bus for transmission to another transceiver connected to the bus. The receiver (R) in each transceiver package receives signals from the bus and delivers it to its output which is subsequently delivered to the device (not shown) which the transceiver attaches to the bus. For test purposes, a driver, in a transceiver module, can output signals on the bus and the signals are received at the input of the receiver. This wrap-around feature allows a transceiver to test its operability before it is connected into the bus.

Figure 1A:
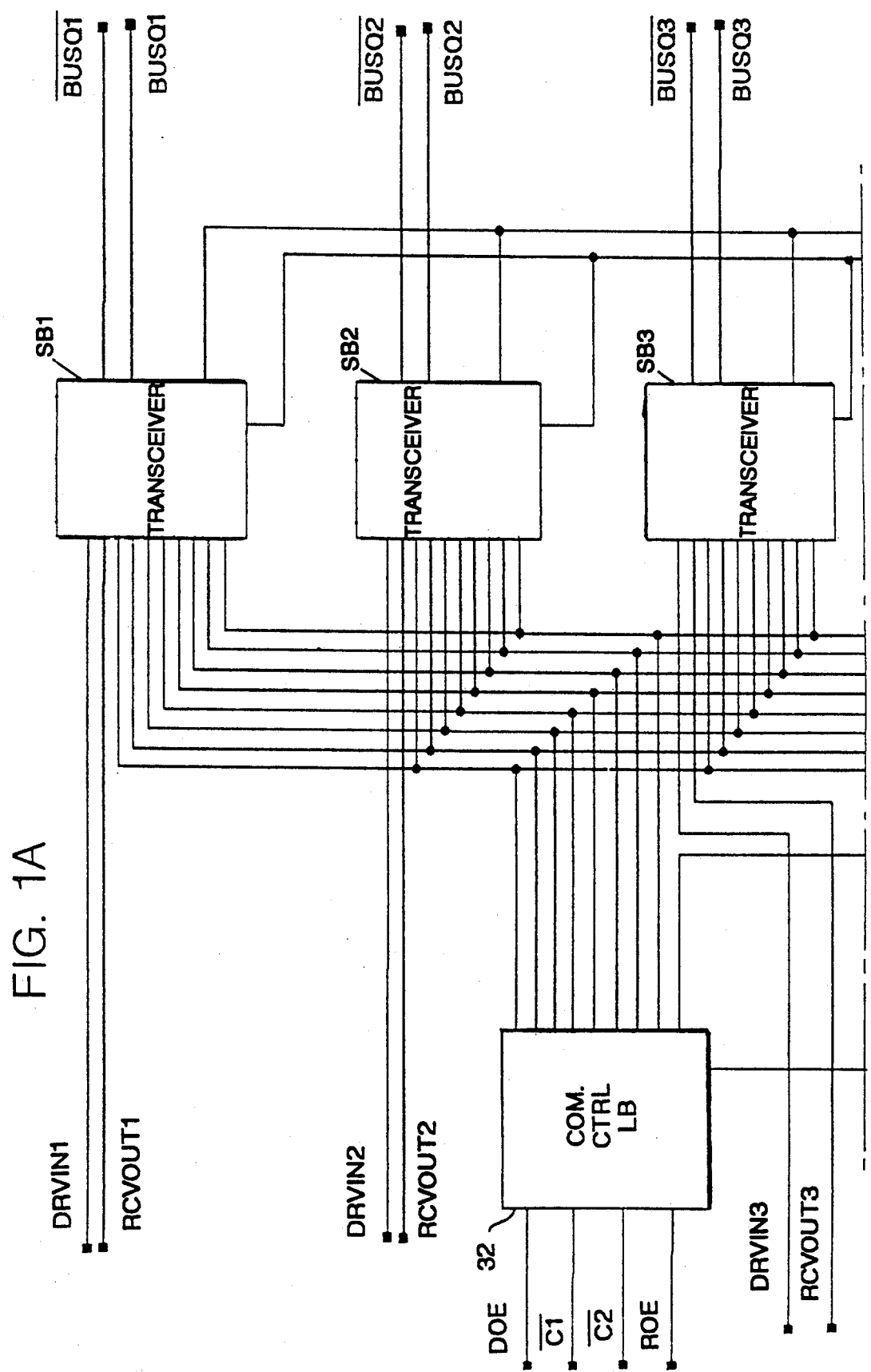
Figure 2:
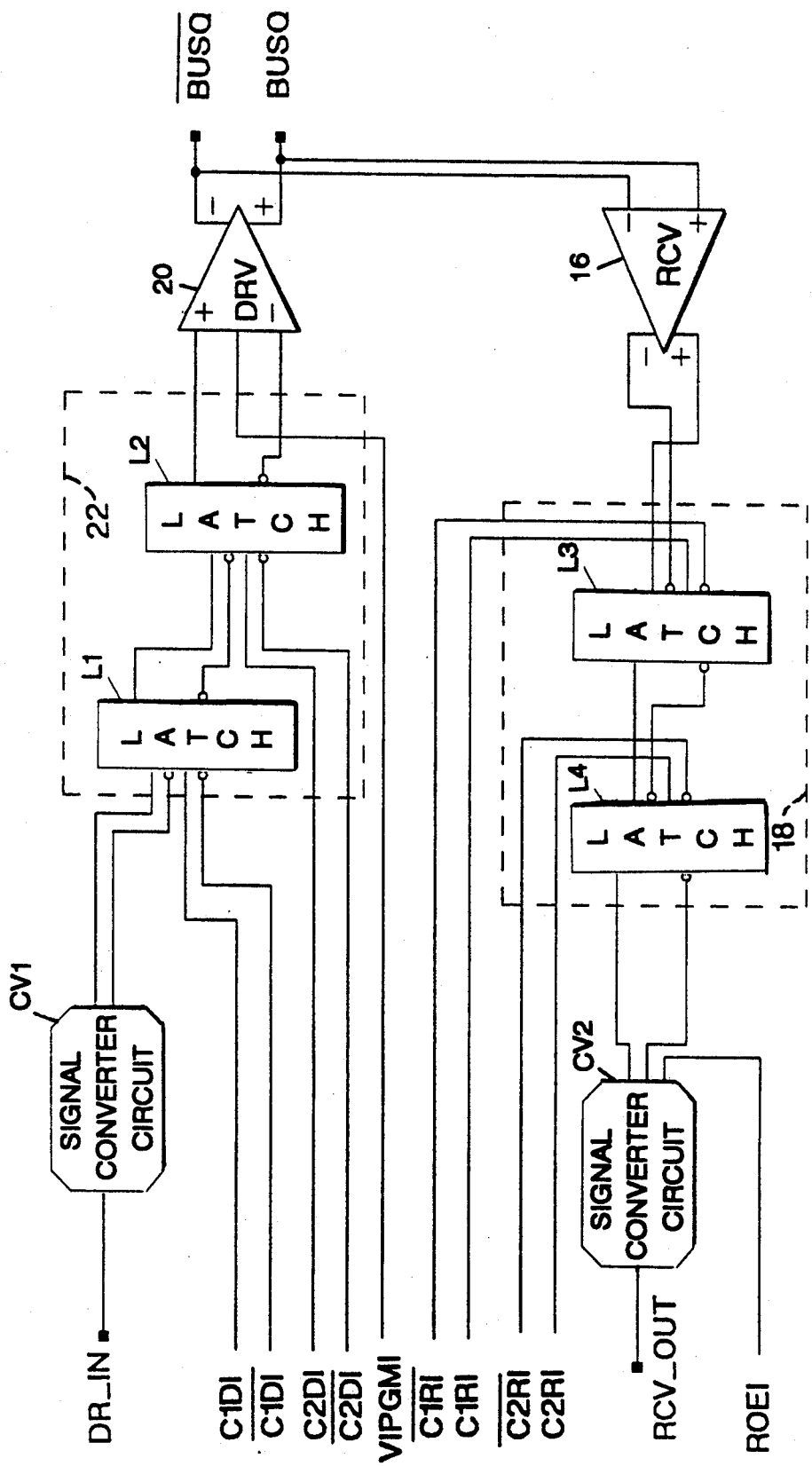
FIG. 2 shows a block diagram of one-bit of the hybrid transceiver according to the teachings of the present invention.

FIG. 2 shows a block diagram of the transceiver according to the teachings of the present invention. It is worthwhile noting, at this point, that the transceivers are identical; therefore, the description to be given hereinafter is the same for each transceiver. The transceiver shown in FIG. 2 represents the data path for a single bit. For the particular problems posed above, a packaging density of five bits per package has been deemed optimal. Turning to FIGS. 1A and 1B for the moment, a block diagram of a module with the preferred bit density is shown. The module includes five single bit transceivers (SB1, SB2, SB3, SB4 and SB5) interconnected to a common control logic block 32 (Com Ctrl L B). The details of the single bits and the control logic block will be given subsequently. Suffice it to say that the control logic block 32 receives (buffers) and converts clock signals (C1 and C2) and control signals (DOE and ROE) to differential logic level signals which are distributed to drive the single bit transceivers. The package chosen as optimal is a 28 pin plastic chip carrier (PCC) surface-mount package, to minimize wiring length and lead inductance. Depending upon application, other packaging densities may be deemed desirable without departing from the teachings of the present invention.

Still referring to FIG. 2, the rectangular pads connected to each line represent input and output contact points or nodes for the chip. The data input signal (DR_IN) and receiver output (RCV_OUT) are industry standard transistor-transistor logic (TTL) levels in the preferred embodiment. The clock signals (C1) and (C2), driver output enable (DOE) and receiver output enable (ROE) are positive emitter-coupled logic (PECL) levels in the preferred embodiment. These voltage levels are approximately 3.2 volts for logic "0" and 4.1 volts for logic "1". Depending on application, other levels for all inputs and outputs may be deemed desirable without departing from the teachings of the present invention. The relationship of the named signals and the function which they serve will be described subsequently.

As stated previously, each transceiver includes a driver section and a receiver section. The receiver section includes a receiver (RCV 16) having its inputs connected to sides BUSQ and $\overline{BUSQ}$ of the bus. The output of receiver 16 is connected to latching means 18 which is formed from latches L3 and L4. The latching means 18 pipeline data from receiver 16 into signal converter circuit means CV2. When activated by the signal ROE, $CV_2$ converts and level shifts differential ECU input signals into a single-ended TTU output signal on the line labeled RCV OUT. The signal converter circuit $CV_2$ is an off-the-shelf circuit arrangement which converts a double-ended signal into a single-ended one. For example, an appropriate module is one bit of a Motorola MC 10H350.

Likewise receiver 16 is a differential input, differential output voltage comparator, similar in function to National Semiconductor LM360.

Still referring to FIG. 2, drive data is presented to the chip at the DR_IN line using transistor-to-transistor logic (TTL) signal levels. The data is converted to differential data via circuit conversion means CV1 and presented to latch circuit L1. The falling edge of the C1D1 line clocks this data to the input of latch L1. The falling edge of the C2D1 line clocks this data to the input of latch L2 which, in turn, presents the data to the input of driver circuit 20. The driver circuit 20 (details to be given hereinafter) is a custom designed circuit which provides the proper interface to the differential bus (BUSQ and $\overline{BUSQ}$).

The path for the receive signal from the bus is similar. The receiver circuit 16 is a differential comparator with a small amount of input offset voltage applied in order to guarantee a known state at its output during the time that no signals are present on the bus. The received output signal is applied to the input of latch L4. This latch is clocked by the C1 clock such that the falling edge of C1RI presents the received data to the input of latch L3. Similarly, the falling edge of C2RI clocks data to the input of the converter circuit (CV2). The converter circuit CV2 converts the emitter coupled logic (ECL) differential signal to the TTL single-ended output on pin labeled RCV-OUT. It should be noted that the circuit architecture employed maintains the data in differential (ECL) form as much as possible on the chip. This technique provides maximum speed, minimum power and minimizes noise radiation to other circuits (both on and off-chip). The means is also provided to simultaneously inhibit all drivers and/or receivers on the chip. The receivers are disabled via the signal on the line labeled ROEI. Disabling turns off the output stages of CV2 such that neither up nor down level is active (high impedance output). The drivers are similarly turned off via the DOE signal line. The control circuit PGMA 15 (FIG. 5) is a custom circuit (details to be given hereinafter) which set the controller reference current for all five drivers on the chip. The DOE signal line is used as an input to the PGMA 15 circuit in order to turn off (or on) the reference current. Thus, the drivers can be simultaneously disabled when the DOE line goes inactive. In the preferred embodiment, the inactive state for DOE is an ECL downlevel. In order to minimize on chip delays, the two clock signals C1 and C2 and enable signals ROE and DOE are carried as differential signals on the chip.

Figure 5:
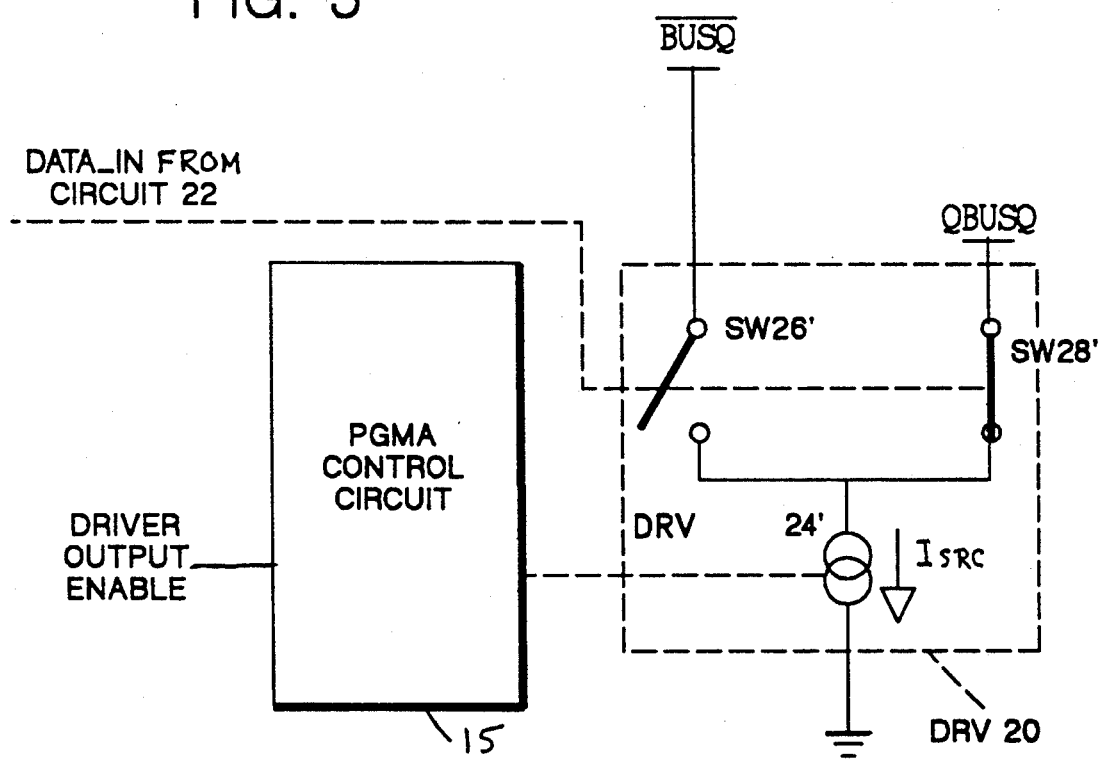
FIG. 5 shows a functional representation of the driver circuit and controller.

FIG. 5 shows a functional representation of the PGMA control circuit 15 and driver circuit 20. The driver circuit 20 includes a current source 24' coupled by individually activatable switches SW26' and SW28' to respective sides of the differential bus ($\overline{BUSQ}$, BUSQ). When enabled via a signal on the output enabled signal line (DOE), the PGMA control circuit 15 sets a fixed amount of current ISRC which is sinked from the side of the bus that is coupled to the current source via one of the switches. Therefore, by using the pseudo differential switch and control circuit, current is sinked from only one side of the bus while the other side remains undisturbed.

Figure 3:
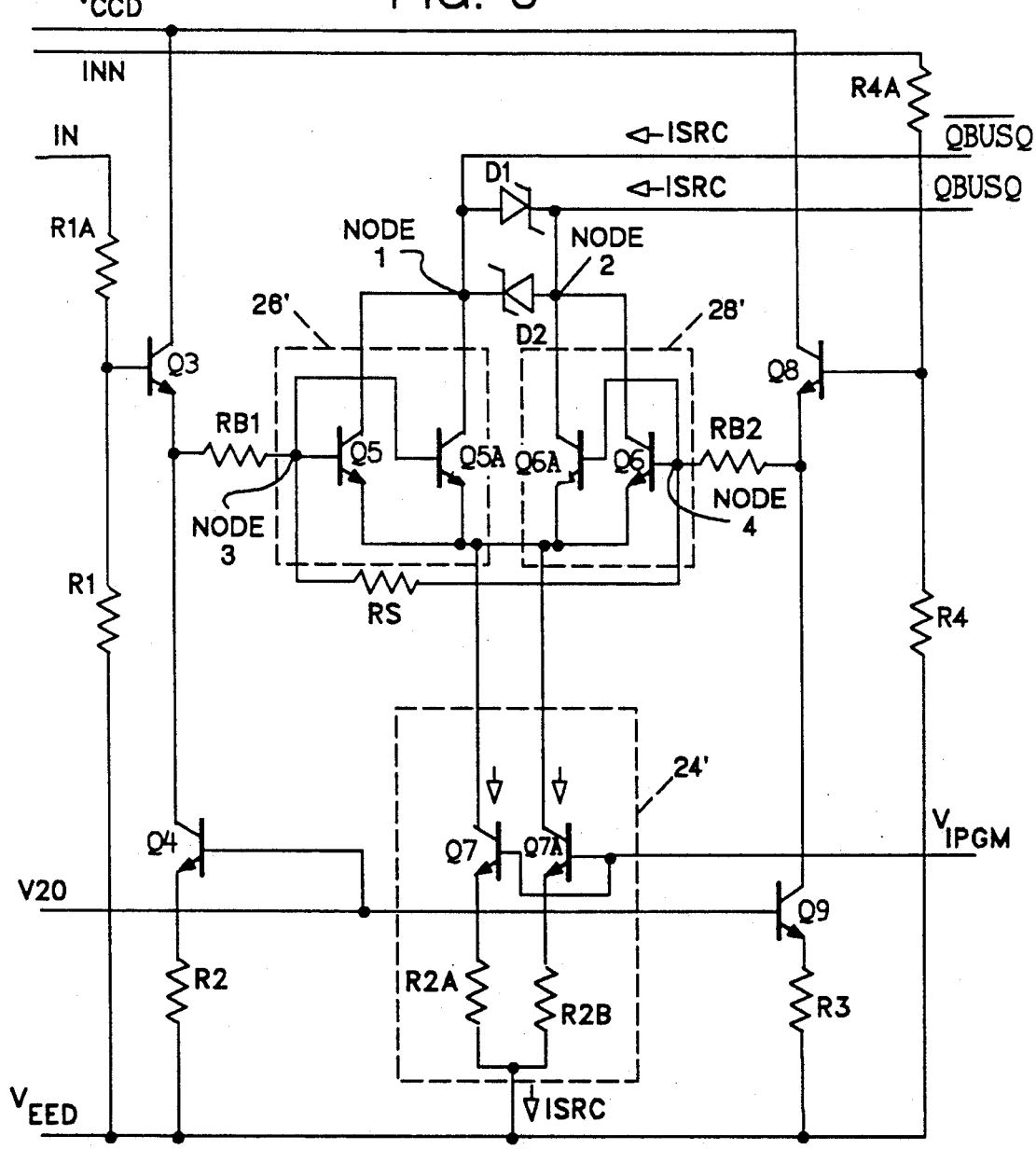
FIG. 3 shows a circuit schematic of the driver circuit.

FIG. 3 shows a detailed schematic for the driver circuit 20. Similar components in FIGS. 3 and 5 are labeled with the same alpha numeric characters and/or numerals. The circuit includes current source 24' interconnected to BUSQ and $\overline{BUSQ}$ by differential switches 26' and 28', respectively. The differential switch 26' is coupled by R1A, device Q3, RB1 and R1 to side IN of an input differential signal and to power supply rails $V_{CCD}$ and $V_{EED}$. The emitter of device Q3 is coupled by device Q4 to voltage node V20 (details to be given hereinafter) and power supply rail $V_{EED}$. Likewise, the differential switch 28' is coupled by R4A device Q8, RB2 and R4 to side INN of the differential input signal and power supply rails $V_{CCD}$ and $V_{EED}$. The emitter of device Q8 is coupled through device Q9 and R3 to voltage node V20 and power supply rail $V_{EED}$.

Still referring to FIG. 3, the differential switches 26' and 28' include differential pairs Q5, Q5A, Q6 and Q6A. The collectors of the devices are connected directly to the bus (BUSQ and $\overline{BUSQ}$). A reference voltage (VIPGM) is supplied by the PGMA control circuit 15 (details to be given hereinafter) when the drivers are to be activated via the DOE line (FIG. 2). A fixed amount of current $I_{SRC}$ is then set up in the collectors of devices Q7 and Q7A respectively. In the preferred embodiment of this invention, $I_{SRC}$ is approximately 16 milliamps through the collector electrode of Q7 and Q7A respectively. It should be noted that other ratios of current can be drawn by current source 24' without deviating from the spirit and scope of the present invention. The driver output current is switched to either node on the BUSQ or $\overline{BUSQ}$ side of the bus by the input data which appears differentially at the circuit inputs (IN and INN). The resistor strings consisting of R1, R1A, R4 and R4A provide level shifting for the input signal which appears at the bases of Q3 and Q8 respectively. The devices Q3 and Q8 buffer the input signal and deliver them to the base of devices Q5 and Q6 respectively. The differential input voltage (IN, INN) is then applied to the current switching devices Q5A and Q6 and Q6A. The Schottky diodes D1 and D2 are connected across the bus in order to limit the maximum signal swing and provide some attenuation for noise that may be coupled to the bus. Resistor RB1, RB2 and RS provide high frequency compensation during the switching transients. Devices Q4, Q9, R2 and R3 provide a small bias current for buffer devices Q3 and Q8. The bias current is derived from the voltage at node V20.

Preferably, V20 is a reference voltage supplied by an on-chip band gap reference circuit. The circuit is similar in function to the National Semiconductor LN113 and LN185 reference diode devices.

Figure 4:
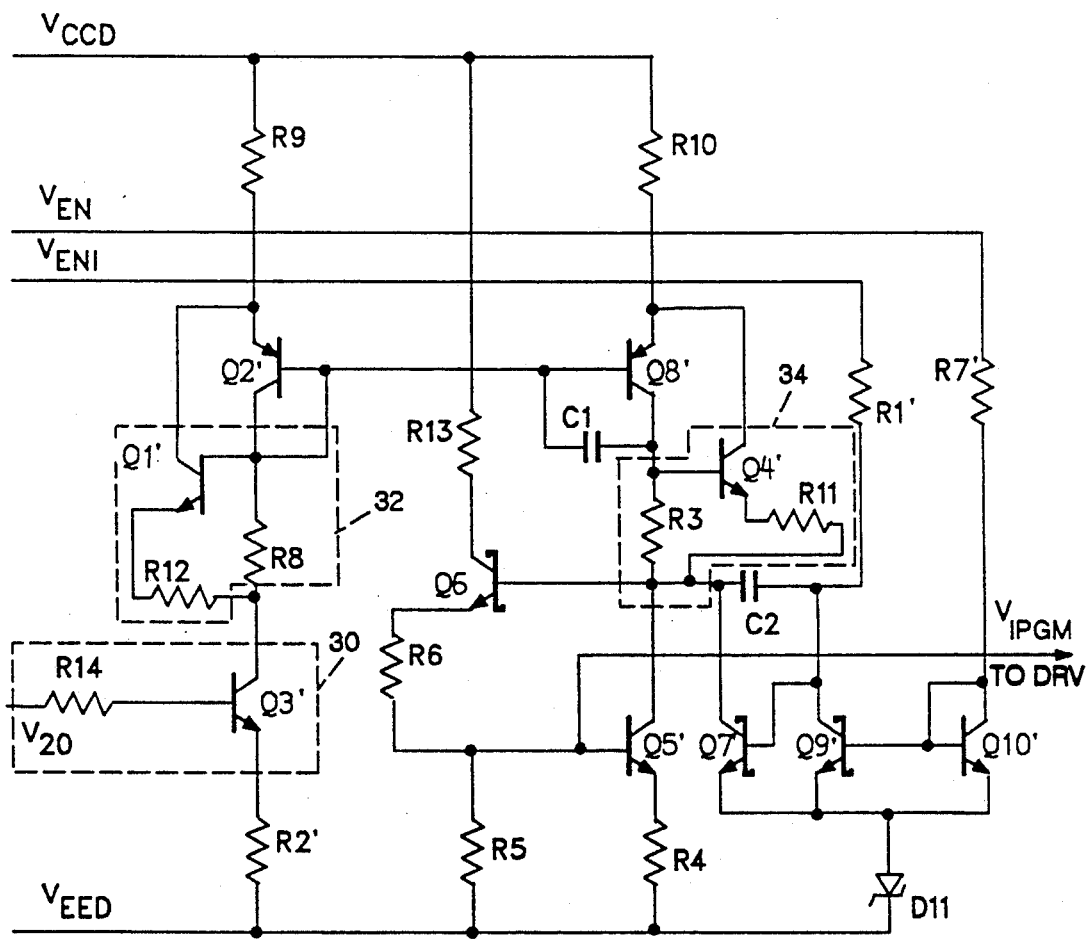
FIG. 4 shows a circuit schematic of the circuit which enables the driver circuit.

FIG. 4 shows a electrical schematic for the PGMA control circuit 15. The function of the PGMA control circuit 15 is to set the controller reference current for all (five) drivers on the chip. The PGMA control circuit 15 includes a reference current generator 30 (Q3', V20, R14) for generating a reference current. The reference current generator 30 is coupled by current gain circuit arrangement 32 to current mirror formed by devices Q2', R9, Q8' and R10. The current mirror is coupled by current gain circuit arrangement 34 to the collector electrode of reference connected device Q5'. The base of device Q5' is connected to signal line labeled VIPGM which sets up reference current in the drivers. The emitter electrode of reference device Q5' is connected through a rapid turn-on turn-off circuit formed from devices Q7', Q9', Q10', D11, R1' and R7'.

Still referring to FIG. 4 for proper operation, the circuit elements in FIG. 4 are closely matched with the circuit component of FIG. 3. This match insures that an accurate amount of current is sourced from either side of the differential bus. In the preferred embodiment of this invention, a reference current of approximately 1 milliamp is set in Q3 collector via the on-chip band-gap voltage at node V20. Devices Q2', Q8', and resistors R9 and R10 provide a current mirror with a gain of 2. This means that approximately two milliamps are available at the Q8' collector. Devices Q1', Q4', R8, R12, R3 and R11 are used to provide additional current gain for the PNP current mirror devices (Q2' and Q8'). It should be noted that circuit means 32 and 34 are used to compensate for the relatively low Betas of the lateral PNP devices Q2' and Q8'. The 2 milliamp provided at Q8' collector electrode is applied to the reference connected device Q5'. A precise voltage drop is set up across R4 which interconnects the emitter of Q5' to voltage supply rail $V_{EED}$. The base of Q5' (node VIPGM) therefore becomes a reference node used to set up the current references in each of the five driver circuits in a transceiver module.

As stated previously, components in FIG. 4 are closely matched with components in FIG. 3 to enhance the desirable operation of the described circuit. To this end, the resistor R4 is matched to the resistors R2A and R2B (FIG. 3) in each of the driver circuits such that the ratios (160 ohms/40 ohm) produce a 4 times increase in current in the emitters of Q7 and Q7A (FIG. 3). In addition, devices Q7 and Q7A (FIG. 3) are also ratioed by a factor of 4 relative to device Q5 (FIG. 3) in order to improve accuracy of the current source. Therefore, the total current into the emitters of the differential drive devices Q5, Q5A, Q6, and Q6A is 16 milliamps. As stated previously, these figures are mere exemplary and should not limit the scope of this invention.

Still referring to FIG. 4, the device Q6 is used as a buffer transistor (current gain) for the reference circuit to minimize loading effects of the multiple driver circuits on the single reference circuit. Resistors R6 and R13 along with capacitor C1 provide frequency compensation for the reference circuit. The DOE signal (FIG. 2) is converted via Com Ctrl L B 32 (FIG. 2) to differential signal VEN and VEN1 (FIG. 4). This differential signal VEN and VEN1 are applied to resistors R1' and R7'. As a result, nearly identical current is set up in devices Q9' and Q10'. Since device Q10' is diode connected, the voltage at the collector electrode of device Q9' tends to stay at one diode drop above the reference point established by the anode of Schottky diode D11. This means, in turn, that the base of Q7' can be rapidly raised or lowered (that is, turned on or off) through the voltage range necessary to either turn Q7' on or off very quickly. When Q7' is turned on via lowering of VEN and the simultaneous raising of VEN1, Q7' shunts the reference current setup by the current mirror into Q7' and D11. This action removes the current from the reference circuit formed by device Q5' and R4 which cause reference node VIPGM to drop in voltage, thereby turning off all five drivers on the chip. The capacitor C2 is used to enhance the discharge of Q7' collector node, effectively speeding up the circuit. R5 is used as a bleeder resistor to further enhance the discharge of node VIPGM when it is going to the disenabled state.

Among the advantages offered by the disclosed device are 1) maximum immunity to noise coupled from other signal lines, and reduced loop area for EMI radiation generation;

2) capability to operate at one-half the signal swing required for even single-ended ECL, further reducing EMI and coupled noise problems, since the important quantity for reception given a constant noise margin is the relative difference between the signal levels and the reference; The signal swing for differential lines need be only half that of single ended lines since the second signal line serves as a reference.

3) A conventional voltage comparator can be used as a receive circuit, with optimum noise margin unaffected by variations in the card power supply voltage (since no reference voltage is required).

4) The circuit offers the lowest device capacitance of the circuits examined since the circuit presents only a single transistor collector to the bus. Use of a reasonably small current drive level (in this case, 16 milliamp) would allow the use of small devices, resulting in a low value of collector to substrate capacitance. This would, in turn, provide a low stub capacitance and minimize bus impedance variation with additional card loading.

5) Current mode output provides high output impedance. This has two advantages over a voltage drive circuit arrangement; namely, a) signals traveling on the bus do not reflect off the impedance mismatch seen at the driving circuit as would be the case with the voltage mode driver which looks to the bus as a very low impedance.

b) a current mode driver is inherently hot pluggable since current is only sourced or sinked when the driver circuit is enabled. Designing a voltage mode driver to meet the hot plug requirement would be a major challenge.

6) Constant power supply and ground current during signal transmission, eliminating simultaneous switching noise except during enabling and disenabling of the drivers. This feature significantly reduces both system noise and EMI.

7) Constant termination current when enabled. This is significant since the terminating resistors are to be located on separate cards pluggable into the end slots of the backplane but supplied by DC to DC converters on the interchange (control) cards. Therefore, large data-dependent transient current requirements for the terminators were expected to cause significant noise problems were they to exist.

8) Packaging five bits to a chip provides an optimum tradeoff between maximizing packaging density and minimizing stub lengths between the bus and the transceivers.

9) Separate driver and receiver enable inputs permit "wraparound" operation for diagnostic purposes.

10) Inherent card failure protection of the bus (if an on-card power supply or component fails, the bus can still function).

While there has been described a preferred embodiment of the present invention, variations and modifications in that embodiment may occur to those skilled in the art once they learn of the basic inventive concepts. Therefore, it is intended that the appended claims shall be construed to include both the preferred embodiment and all such variations and modifications as fall within the spirit and scope of the invention. What is desired to be protected by Letters Patent is:

We claim:

1. A high performance bus system comprising:
    a pseudo-differential bus;
    at least one connector coupled to the differential bus; and
    at least one transceiver connected to the connector; said transceiver including a differential drive circuit arrangement which sinks a fixed amount of current from one side of the pseudo-differential bus while another side of said pseudo-differential bus is undisturbed.

2. The high performance bus system of claim 1 wherein the transceiver further includes a circuit means for receiving data signals from the pseudo-differential bus.

3. The high performance bus system of claim 2 wherein the circuit means includes a differential comparator with its output biased to a selected voltage level.

4. The high performance bus system of claim 3 wherein the pseudo-differential bus includes:
    a pair of terminals of voltage VT for supplying power to the bus;
    a plurality of conductor pairs, each one transmitting a data bit;
    terminating means for inhibiting signal reflection connected to both ends of the conductors.

5. The high performance bus system of claim 4 wherein the terminating means includes a circuit arrangement which terminates both even and odd signal propagation modes.

6. The high performance bus system of claim 5 wherein the circuit arrangement includes a set of resistors interconnected in a series/parallel configuration, with one end of each of the parallel resistors connected to one side of the pseudo-differential bus and another end of each of the parallel resistors connected to one end of the series resistors which is connected to one of the terminals of voltage VT.

7. An improved transceiver for use with a multidrop pseudo-differential bus comprising:
    a first circuit means for receiving a single ended signal representative of data bits; said first circuit means level shifting and converting the signal into differential signals;
    a second circuit means responsive to the differential signals and clock signals to pipeline data bits;
    a differential driver circuit for receiving the bits, said differential driver circuit responsive to a control signal to activate or deactivate its output on said pseudo-differential bus;

a third circuit means for receiving an enabling single ended signal and converting it into enabling differential signals; and a fourth circuit means for receiving the enabling differential signals and generating the control signal which causes a fixed amount of current to be sinked from said pseudo-differential bus.

8. The improved transceiver of claim 7 further including a receiving circuit means with differential inputs for coupling to outputs of the differential driver;

a fifth circuit means responsive to a set of clock signals for pipelining data outputted from the receiving circuit; and a sixth circuit means for receiving differential data signals from the fifth circuit means and converting said differential data signal into a single ended TTL level signal.

9. The improved transceiver of claim 8 wherein the second and fifth circuit means includes;

a pair of series connected polarity-hold latches; and a pair of non-overlapping clock signals for gating data into selected ones of the pair of series connected polarity-hold latches.

10. The improved transceiver of claim 9 wherein the differential driver circuit includes:

a voltage supply node for supplying power;

a referenced node;

a differential circuit arrangement for sinking current from each side of the differential bus; said differential circuit arrangement having a first node coupled to one side of the differential bus, a second node coupled to another side of the differential bus, a third node, a fourth node and a fifth node;

a current source interconnecting the fifth node to the referenced node;

compensation circuit means for providing high frequency compensation during switching, connected to nodes 3 and 4;

a first amplifying device coupled to the compensation circuit means;

a second amplifying device coupled to the compensation circuit means;

a seventh circuit means for providing level shifting to a differential signal connected to the first amplifying device;

an eight circuit means for providing level shifting to said differential signal connected to the second amplifying means.

11. The improved transceiver of claim 10 further including a ninth circuit means for providing bias current, interconnecting the first amplifying device and second amplifying device to the reference node.

12. The improved transceiver of claim 11 further including a control means for activating/deactivating the differential driver circuit.

13. The improved transceiver of claim 10 wherein the differential circuit arrangement includes a first set of multiple parallel connected bipolar devices, and a second set of multiple parallel connected bipolar devices, with the emitter electrode of each set of the bipolar devices connected to node 5, the collector electrodes of the first set connected to node 1, the base electrodes of the first set connected to node 3, the collector electrode of the second set connected to node 4.

14. The improved transceiver of claim 13 wherein the current source includes a third set of multiple bipolar transistors connected in parallel with a collector electrode of each transistor connected to node 5, a base electrode of each transistor connected to a control node;

a first resistive means interconnecting an emitter electrode of one of the transistors in the third set to the reference node; and a second resistive means interconnecting an emitter electrode of another of the transistor in the third set to the reference node.

15. The improved transceiver of claim 14 wherein the compensation circuit means includes:

a first resistor interconnecting node 3 to node 4;

a second resistor connected to node 3; and a third resistor connected to node 4.

16. The improved transceiver of claim 15 wherein the first amplifying device includes a bipolar transistor having an emitter electrode coupled to the second resistor, a base electrode and a collector electrode connected to the voltage supply node.

17. The improved transceiver of claim 16 wherein the second amplifying device includes a bipolar transistor having an emitter electrode connected to the third resistor, a base electrode and a collector electrode connected to the voltage supply node.

18. The improved transceiver of claim 17 wherein the seventh circuit means includes a pair of resistors connected in series and interconnecting an input node to the reference node; said pair of resistors including a node intermediate said resistors and connected to a base electrode of the first amplifying device.

19. The improved transceiver of claim 18 wherein the eighth circuit means includes a pair of resistors connected in series and interconnecting another input node to the reference node; said pair of resistors including a node positioned intermediate said resistors and connected to a base electrode of the second amplifying device.

20. The improved transceiver of claim 19 wherein the ninth circuit means includes a first transistor device having a collector electrode connected to the second resistor, an emitter electrode and a base electrode;

a resistor connecting the emitter electrode to the reference node;

a second transistor device having a base electrode connected to the base electrode of the first transistor; a collector electrode connected to the third resistor and an emitter electrode; and a resistor interconnecting the emitter electrode of the second transistor to the reference node.

21. The improved transceiver of claim 20 wherein the control means includes a first means for generating a desired reference current;

a second means coupled to the first means; said second means mirroring and amplifying the reference current;

a third circuit means for generating a precise reference current interconnecting the second means to the reference node; and a fourth circuit means coupling the third circuit means to the reference node and input nodes of bipolar enabling signals; said fourth circuit means responding to the bipolar enabling signals to provide a rapid turn-on or turn-off to the third circuit means.

22. In a digital device having a bus system with a pseudo-differential multi-drop bus and transceivers connected to said bus, an improved driver circuit comprising:

a differential circuit arrangement coupled to the pseudo-differential multi-drop bus;

a current sourcing means for sinking a fixed amount of current coupled to the differential circuit arrangement; and a control means coupled to the current sourcing means;

said control means responsive to an enabling signal provided by the digital device to cause selected circuits on the pseudo-differential circuit arrangement to sink the fixed amount of current from only one side of the differential multi-drop bus while another side of said bus is not disturbed.

23. The improved driver circuit of claim 22 wherein the current sourcing means includes a first FET device and optional multiple FET devices connected in parallel with gate electrodes of each FET connected to a common node and the drain electrodes of each FET coupled to the differential circuit arrangement;

a first resistive means interconnecting an source electrode of the first FET device to a reference node; and a second resistive means interconnecting an source electrode of the second FET device to the reference node.

24. The improved driver circuit of claim 22 wherein the control means includes a first circuit means for generating a reference current;

a second circuit means for mirroring the reference current coupled to the first circuit means;

a third circuit means for translating the reference current to a referenced node coupled to the second circuit means; and a circuit arrangement coupled to the third circuit means; said circuit arrangement responsive to enabling signals to provide a rapid turn-on or turn-off of the third circuit means.

25. In a computer having a high speed multidrop bus and transceivers connected to the bus with each transceiver having a driver section for sending data on the bus and a receiver section for receiving data from the bus, an improved controller for controlling the driver section comprising:

a first circuit means for generating a reference current;

a second circuit means for mirroring the reference current coupled to the first circuit means;

a third circuit means for translating the reference current to a referenced node coupled to the second circuit means; and a circuit arrangement coupled to the third circuit means; said circuit arrangement responsive to enabling signals to provide a rapid turn-on or turn-off of the third circuit means.

* * * * *